(12) United States Patent
Rhodes

(10) Patent No.: US 7,279,353 B2
(45) Date of Patent: Oct. 9, 2007

(54) PASSIVATION PLANARIZATION

(75) Inventor: Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/404,145

(22) Filed: Apr. 2, 2003

(65) Prior Publication Data

US 2004/0195595 A1    Oct. 7, 2004

(51) Int. Cl.
H01L 21/00    (2006.01)
(52) U.S. Cl. .......................................... 438/70; 438/72
(58) Field of Classification Search ................ 438/465, 438/724, 744, 757, 769, 114, 954, 791, 22, 438/24, 48, 54, 64, 66, 67, 69, 70, 72, 73, 438/80, 128, 149, 151, 157, 283; 257/626, 257/629, 632, 635, 639, 640, 59, 72
See application file for complete search history.

(56) References Cited

U.S. PATENT DOCUMENTS

| | | | |
|---|---|---|---|
| 5,393,702 A | 2/1995 | Yang et al. | |
| 5,399,533 A | 3/1995 | Pramanik et al. | |
| 5,795,833 A | 8/1998 | Yu et al. | |
| 6,362,498 B2 * | 3/2002 | Abramovich | 257/233 |
| 6,379,992 B2 * | 4/2002 | Jo | 438/70 |
| 6,590,239 B2 | 7/2003 | Hsiung et al. | |

* cited by examiner

Primary Examiner—Hung Vu
(74) Attorney, Agent, or Firm—Dickstein Shapiro LLP

(57) ABSTRACT

A pixel cell is formed by locating a first passivation layer over the final layer of metal lines. Subsequently, the uneven, non-uniform passivation layer is subjected to a planarization process such as chemical mechanical polishing, mechanical abrasion, or etching. A spin-on-glass layer may be deposited over the non-uniform passivation layer prior to planarization. Once a uniform, flat first passivation layer is achieved over the final metal, a second passivation layer, a color filter array, or a lens forming layer with uniform thickness is formed over the first passivation layer. The passivation layers can be oxide, nitride, a combination of oxide and nitride, or other suitable materials. The color filter array layer may also undergo a planarization process prior to formation of the lens forming layer. The present invention is also applicable to other devices.

21 Claims, 9 Drawing Sheets

PASSIVATION PLANARIZATION

FIELD OF THE INVENTION

The present invention relates to the field of semiconductor imaging devices and, in particular, to a color CMOS imager with a passivation layer providing a surface for a filter array.

BACKGROUND OF THE INVENTION

A conventional CMOS imager pixel cell comprises a photoelectric conversion device such as a photodiode for converting light into an electrical charge, a floating diffusion node for receiving the electrical charges, a reset transistor for resetting the floating diffusion node to a predetermined charge state, a source follower transistor for receiving and amplifying a voltage on the floating diffusion node and a row select transistor for gating the source follower transistor output onto a column line. In some pixel cells, a transfer transistor is used to gate charges from the photoelectric conversion device to the floating diffusion node. Each pixel cell also has an associated connection from the floating diffusion node to the source follower transistor. There are also typically other connections to, for example, the reset transistor, row select transistor and transfer transistor, if employed. These connections, comprising metal lines, pass through layers of insulator material that are light-transmissive and run along the surfaces of the insulator layers, forming one or more metallization layers.

A passivation layer is also typically deposited over the final metallization layer by known conventional methods. This deposition may cause a "bread-loafing" effect above the metal lines as the top surface of the passivation material rises up and over the upper metal lines as well as weak areas in between closely spaced conductive lines. Accordingly, a non-uniform passivation layer is produced, which may cause a non-uniform floor for a subsequent filter array coating, which may in turn lead to stress-induced striations, poor color performance and low predictability of the overall image captured by the pixel cell array. The passivation layer can include a deposited oxide, a deposited nitride, or a composite stack of oxide/nitride layers.

In the case of composite stack oxide/nitride layers, the "bread-loafing" effect in the oxide passivation layer over the metal lines also results in very thin nitride coverage over the metal lines at certain metal spacings. Where nitride coverage is thin, or weak, mobile contaminants such as sodium (Na), potassium (K) and copper (Cu) can penetrate into the silicon device region and cause loss of pixel functionality. In some cases, these weak regions, directly adjacent to regions with thick nitride coverage have particularly high stress and may result in nitride layer cracking. This is of particular concern for imaging devices as the color filter array materials typically contain Na and Cu contaminant species. Therefore, a more uniform, flat oxide passivation layer over the final layer of metal lines will allow for a much thinner nitride passivation deposition, reducing stress in the structure of the passivation layer of the pixel cell.

BRIEF SUMMARY OF THE INVENTION

The present invention provides a more uniform upper surface for the passivation layer deposited over the final layer of metal lines by post-deposition surface treating, e.g. by chemical mechanical polishing the passivation layer. As a result, subsequent layers deposited over the passivation layer, such as other passivation layers or a color filter array, can be formed with a more uniform thickness, decreasing the possibility of stress-induced defects and ion contamination. Prior to surface treatment, the thickness of the passivation layer deposition can be measured and the surface treatment adjusted to achieve a desired passivation layer thickness over the photosensor.

In the case of composite stack oxide/nitride layers with a more uniform, flat oxide passivation layer over the final metal, it is possible to achieve a more uniform nitride passivation deposition, reducing stress in the finished passivation layer. By achieving a more uniform, stress-free nitride layer to block mobile ion (Na, K, Cu) contamination, nitride integrity, device reliability and functionality is improved. These and other features of the invention will be more clearly understood from the following detailed description which is provided in connection with the accompanying drawings.

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The term "substrate" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "substrate" in the following description, previous process steps may have been utilized to form regions or junctions in or over the base semiconductor structure or foundation. In addition, the semiconductor need not be silicon-based, but could be based on silicon-germanium, germanium, or gallium arsenide. The term "pixel" refers to a picture element unit cell containing a photosensor and transistors for converting light radiation to an electrical signal. For purposes of illustration, a representative pixel is illustrated in the figures and description herein and, typically, fabrication of all pixels in an imager will proceed simultaneously in a similar fashion. The following detailed description is, therefore, not to be taken in a limiting sense, and the scope of the present invention is defined by the appended claims.

Figure 1:
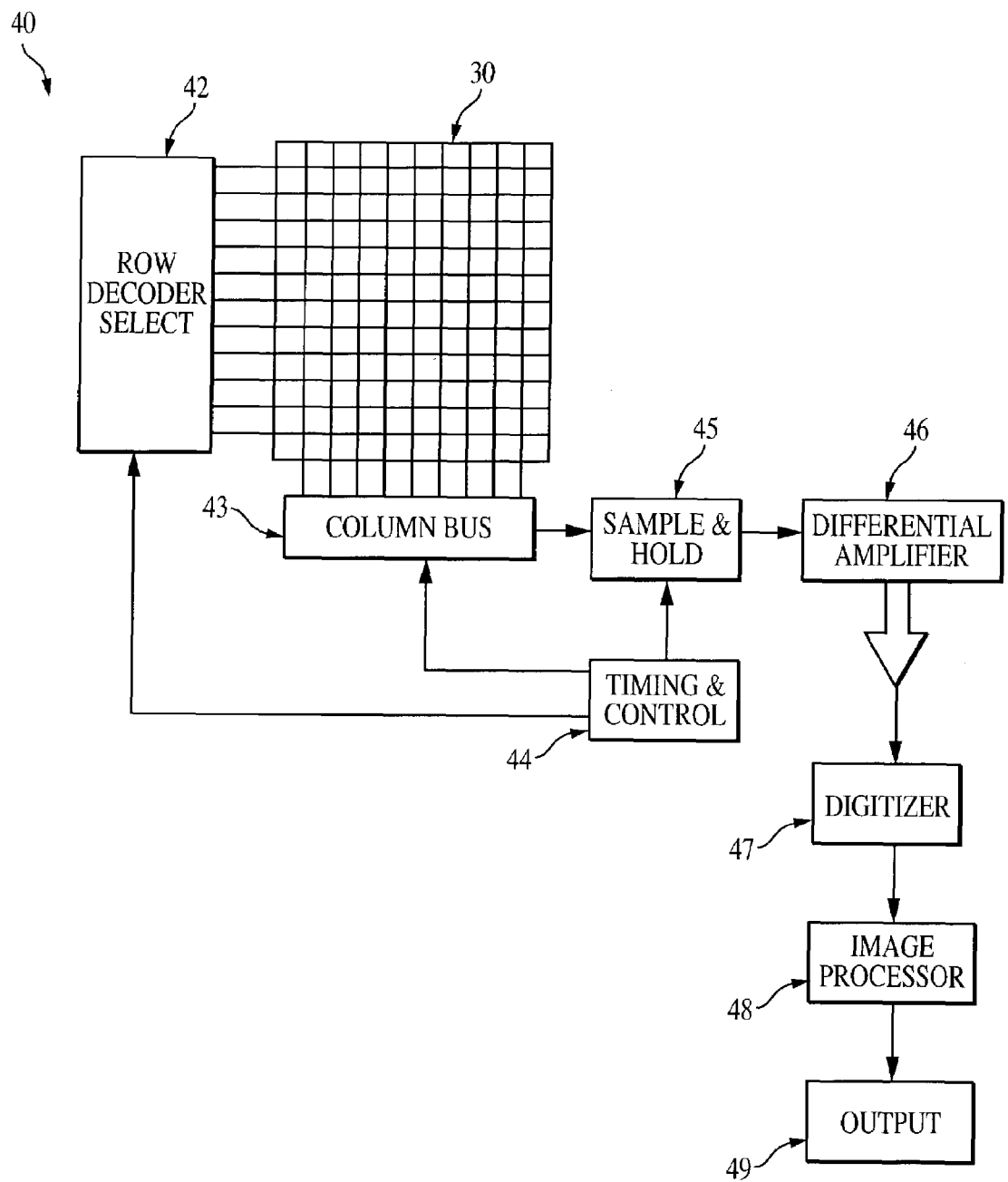
FIG. 1 is a block diagram of a CMOS imager system.

Referring now to the drawings, where like elements are designated by like reference numerals, FIG. 1 shows a CMOS imager system 40 with a pixel array 30 connected to a row decode/selector 42 and column bus 43, which are operated by timing and control circuit 44. The pixel array 30 converts an incident light image into pixel image signals which are used to form an electronic representation of the incident image. The pixels of array 30 are read out row by row and each pixel of the array provides its signals through a column bus. The signals include a reset signal $V_{rst}$ and an image signal $V_{sig}$ and are sent to a sample and hold circuit 45, also operated by timing and control circuit 44. The sample and hold circuit 45 acquires the $V_{rst}$ and $V_{sig}$ signals for each pixel and sends them to a differential amplifier 46 which subtracts them ($V_{rst}-V_{sig}$) to form a pixel output signal for each pixel representing incident light. The pixel signals are then sent to a digitizer 47, image processor 48 and ultimately are provided at an output line 49 as a digitized image signal.

Figure 2:
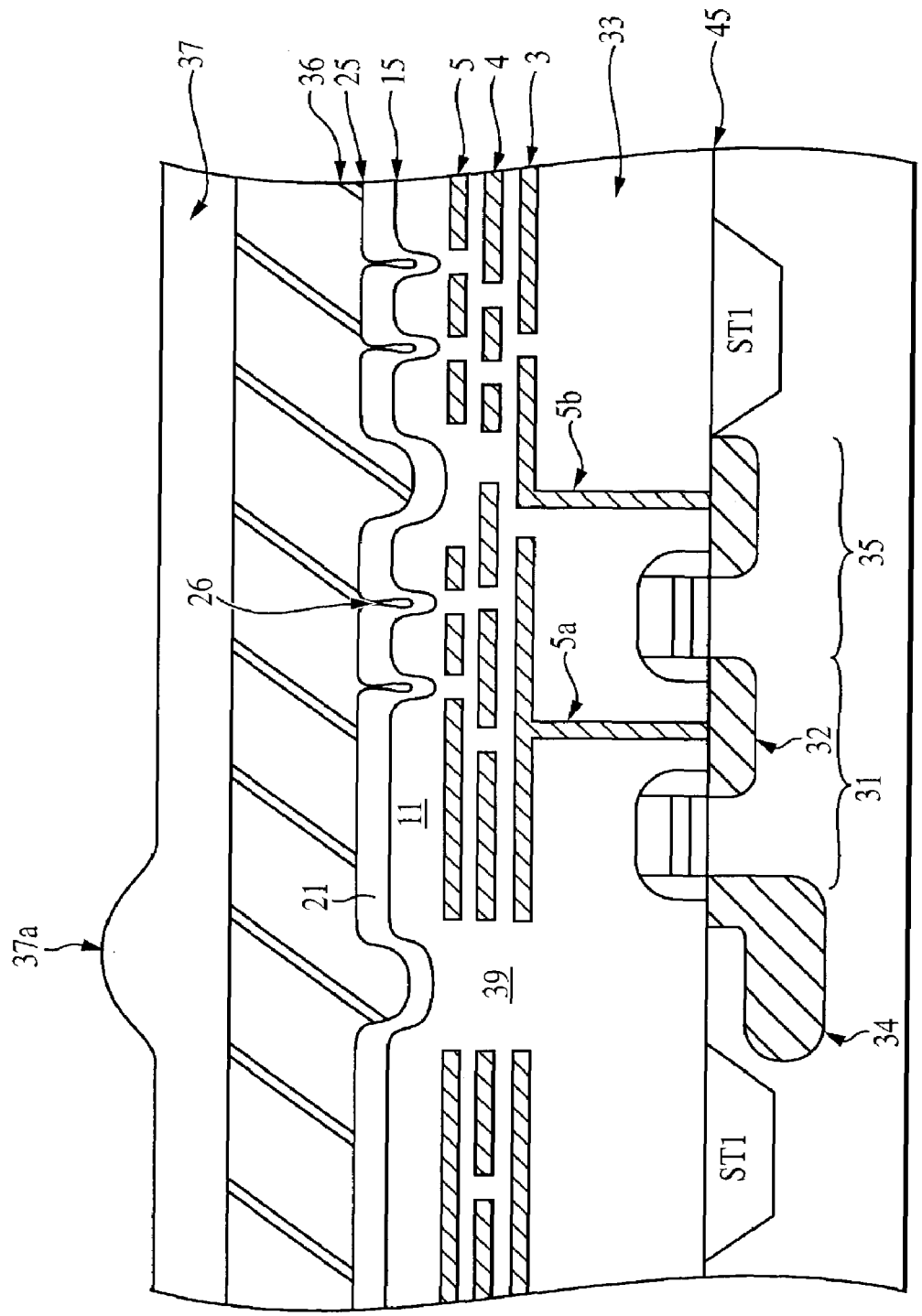
FIG. 2 is a cross-sectional view of a portion of a four transistor pixel cell.

FIG. 2 shows a single pixel four transistor cell employed in array 30. It should be understood that only two of the four transistors, namely, a transfer transistor 31 and a reset transistor 35 are shown in FIG. 2. Formed over the pixel cell is an insulation layer 33, which is light transmissive. A vertical metal line 5a runs from floating diffusion node 32 on the pixel cell through the insulation layer 33 to one of the three horizontal metal layers 3, 4 and 5 which are embedded above insulation layer 33. The metallized layers 3, 4 and 5 are used to connect structures with the pixel cell 30 and the structures of the pixel cell 30 to the processing system shown in FIG. 1. A vertical metal line 5b runs from reset transistor 35 of the pixel cell 30 through the insulation layer 33 to another metallized layer of metallized layers 3, 4 and 5. The metallized layers 3, 4 and 5 are used, among other purposes, to connect the reset transistor 35 to a reset transistor driver by way of metal line 5b and the floating diffusion node 32 to a gate of a source follower transistor of the same pixel cell by way of metal line 5a. It should be noted that metal layers 3, 4 and 5 run horizontally in lateral and orthogonal directions such that an opening 39 is present so that light may pass to a photodiode 34. The level of the silicon substrate level is labeled 45.

An oxide passivation layer 11 is deposited over the final metallization layer 5. The oxide passivation layer surface 15 may have an uneven surface because of the presence of the metal lines in the upper metallization layer 5.

A nitride passivation layer 21 is deposited over the non-uniform oxide passivation layer surface 15. The nitride passivation layer 21 follows the contours of the uneven oxide passivation layer surface 15, such that the nitride passivation layer surface 25 also tends to have an uneven surface. Because the nitride passivation layer 21 may be formed by a deposition process such as chemical vapor deposition (CVD) or a low temperature process such as plasma enhanced chemical vapor deposition (PECVD). As a result, the deposited material tends to form such that the nitride passivation layer 21 develops a thicker profile over the metal lines in the upper metallization layer 5 and a thinner profile between the metal lines. The non-uniform thickness of nitride passivation layer 21 can lead to the formation of keyholes 26 between the metal lines where moisture, sodium (Na), potassium (K), copper (Cu) and other deteriorating elements can penetrate the nitride passivation layer 21. The non-uniform thickness of nitride passivation layer 21 can also create stress within the layer itself, particularly at keyholes 26, making it prone to cracking.

A color filter array 36 is deposited over the nitride passivation layer 21. The color filter array material contains large quantities of sodium (Na) and copper (Cu) contaminants. A lens layer 37 is deposited over the color filter array 36, with a lens 37a being formed directly over the photodiode 34 to direct incident light to the photodiode 34.

Figure 3:
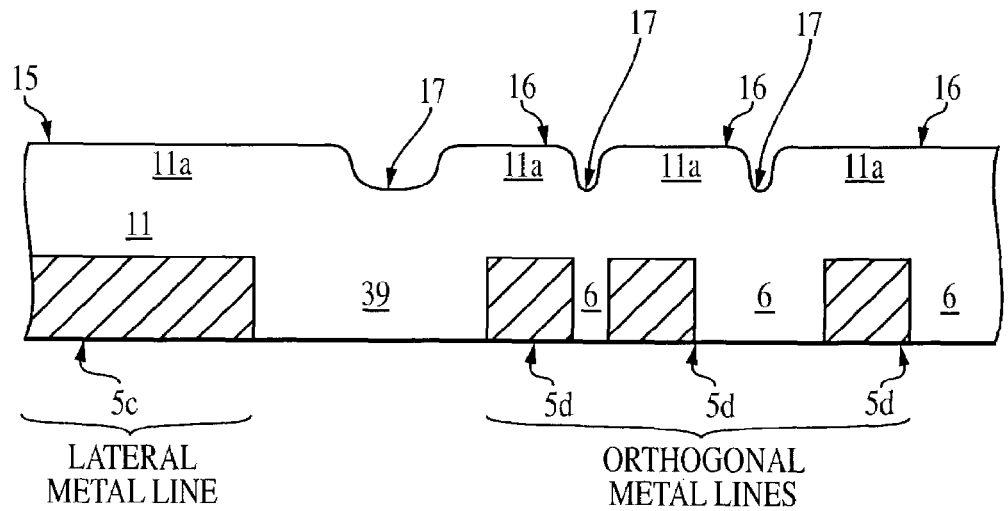
FIG. 3 is an enlarged cross-sectional view of the final metal layer and passivation layer of the FIG. 2 pixel cell, subsequent to formation of the passivation layer.

FIG. 3 shows the pixel cell of FIG. 2, enlarged over the final metallization layer 5 and at the stage of processing subsequent to deposition of the oxide passivation layer 11. At the horizontal level of final metallization layer 5, as shown in FIG. 3, the metal lines run horizontally such that both lateral metal lines 5c and orthogonal metal lines 5d exist on the final metal layer 5 plane. There are spaces 6 between the metal lines 5c and 5d. One such space is an opening 39 which is formed by routing the metal lines 5c and 5d specifically to allow light to be transmitted through the lens 37, color filter array 36, nitride passivation layer 21, oxide passivation layer 11, metal layers 3, 4 and 5, and insulation layer 33 to the photodiode 34 in the pixel cell, as illustrated in FIG. 2.

The oxide passivation layer 11 is formed over the final metal layer 5 by known methods of deposition such as chemical vapor deposition or a low temperature process such as plasma enhanced chemical vapor deposition. As deposited, the non-uniform top surface 15 of oxide passivation layer 11 is uneven, forming "bread-loaf" regions 16 and "valley" regions 17. The "bread-loaf" regions 16 have a concave upper surface, resulting from a thicker layer of the passivation material accumulated at locations directly over the metal lines 5c or 5d. The "valley" regions 17 have a convex upper surface, resulting from a thinner layer of the passivation material accumulated at locations where space 6 and opening 39 exist.

Figure 3A:
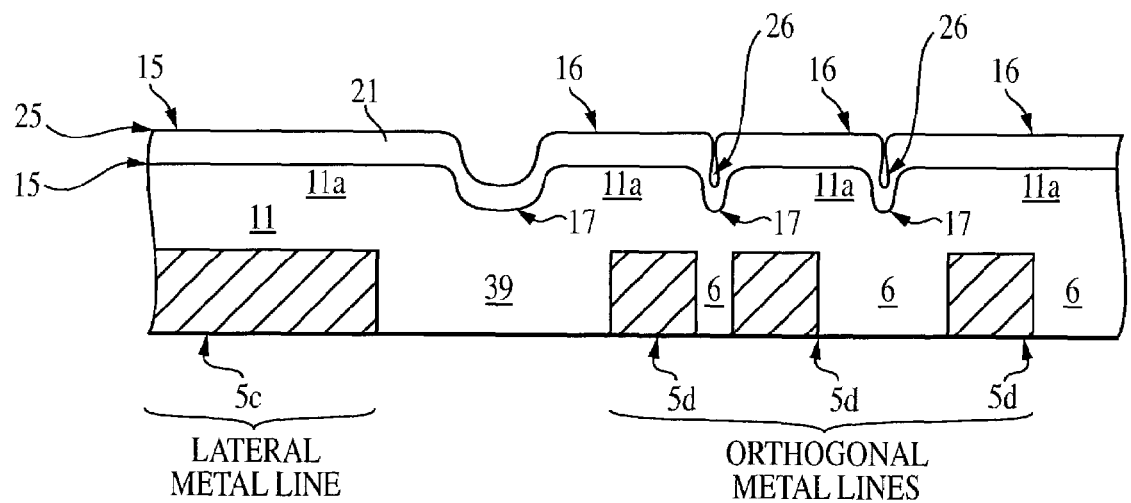
FIG. 3A is an enlarged cross-sectional view of the final metal layer and passivation layer of the pixel cell of FIG. 3 subsequent to processing according to conventional methods.

FIG. 3A shows the pixel cell of FIG. 2, enlarged over the final metallization layer 5 and at the stage of processing subsequent to deposition of the nitride passivation layer 21. According to conventional methods, nitride passivation layer 21 is deposited directly over the non-uniform top surface 15 of oxide passivation layer 11. Where the metal lines 5d are closely spaced, the width of "valley" regions 17 are narrower. Keyholes 26 may form in narrower "valley" regions 17 between the metal lines where moisture, sodium (Na), potassium (K), copper (Cu) and other deteriorating elements can penetrate the nitride passivation layer 21. The site of the keyholes 26 are also prone to stress-induced cracking. To avoid the formation of keyholes 26 and to achieve a more uniform nitride passivation layer, it would be desirable to treat the upper surface 15 of oxide passivation layer 11 to produce a flat surface on which to subsequently deposit a nitride passivation layer.

The desired flat upper surface 10 can be achieved by a planarization process such as chemical mechanical polishing (CMP), spin-on-glass planarization, other mechanical planarization or etching, such as reactive ion etching, ion beam milling, plasma etching, or an anisotropic etching after deposition of the oxide passivation layer. If planarization by etching is used, the passivation layer to be etched must first be coated with resist or spin-on-glass prior to etching to produce a planar surface.

Figure 4:
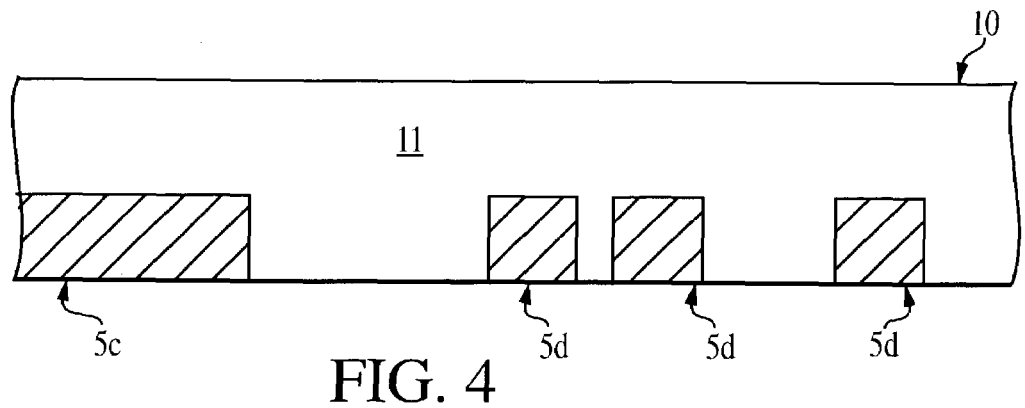
FIG. 4 is an enlarged cross-sectional view of the final metal layer and passivation layer of the pixel cell of FIG. 3 subsequent to processing according to a present invention.

In a preferred embodiment, CMP is performed after deposition of the oxide passivation material. Prior to CMP, the initial oxide passivation deposition thickness is measured from the silicon substrate labeled 45 in FIG. 2 to the lowest "valley" region 17 and to the highest "bread-loaf" region 16. The polish time is adjusted to achieve a desired thickness and the excess oxide passivation deposition 11 a is removed to obtain the desired oxide passivation layer surface 10, as shown in FIG. 4.

Figure 5:
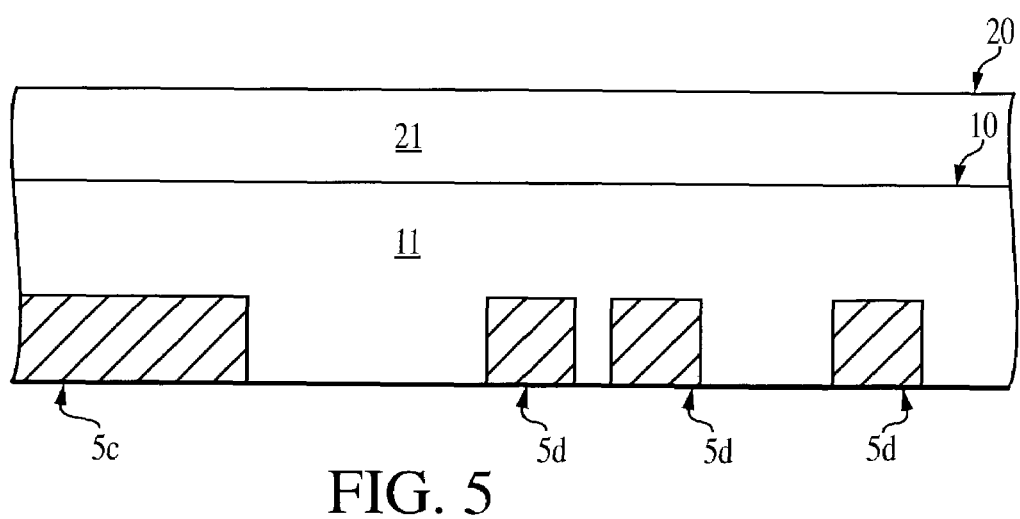
FIG. 5 is an enlarged cross-sectional view of the metal layer and passivation layer of the pixel cell of FIG. 4 at a stage of processing subsequent to that shown in FIG. 4.

FIG. 5 illustrates an enlarged cross-sectional view of the metal layer 5 at a stage of processing subsequent to planarization. A nitride passivation layer 21 is deposited over the oxide passivation layer surface 10. Because the oxide passivation layer surface 10 is flat, the nitride passivation layer 21 likewise has a flat upper surface 20, thereby eliminating the formation of keyholes 26 as illustrated in FIG. 2. Furthermore, the nitride passivation layer 21 has uniform thickness and may be thinner than would be required if it had a non-uniform surface 25. The thinner, uniform nitride passivation layer 21 reduces stress that can occur at locations over "bread-loaf" regions 16 and "valley" regions 17 of oxide passivation layer 11 as shown in FIG. 3.

Figure 6:
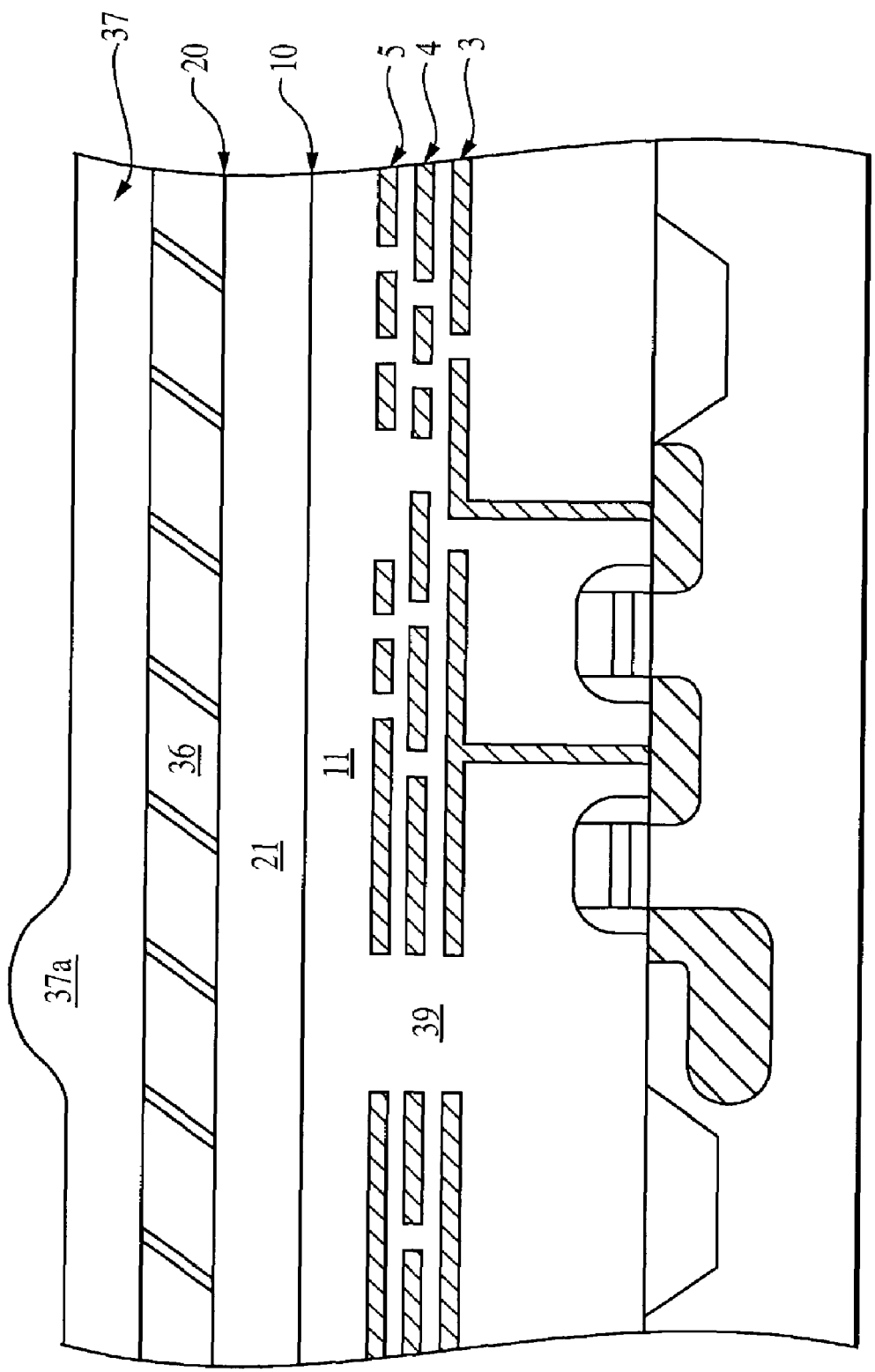
FIG. 6 is a cross-sectional view of the entire pixel cell of FIG. 5 at a stage of processing subsequent to that shown in FIG. 5.

FIG. 6 shows the entire pixel cell of FIG. 5 after oxide passivation layer CMP, subsequent to nitride passivation deposition, and subsequent deposition of color filter array 36 and lens-forming layer 37.

Planarization may also be used on the upper surface of the color filter array layer 36 to improve the light and transmission properties.

Figure 7:
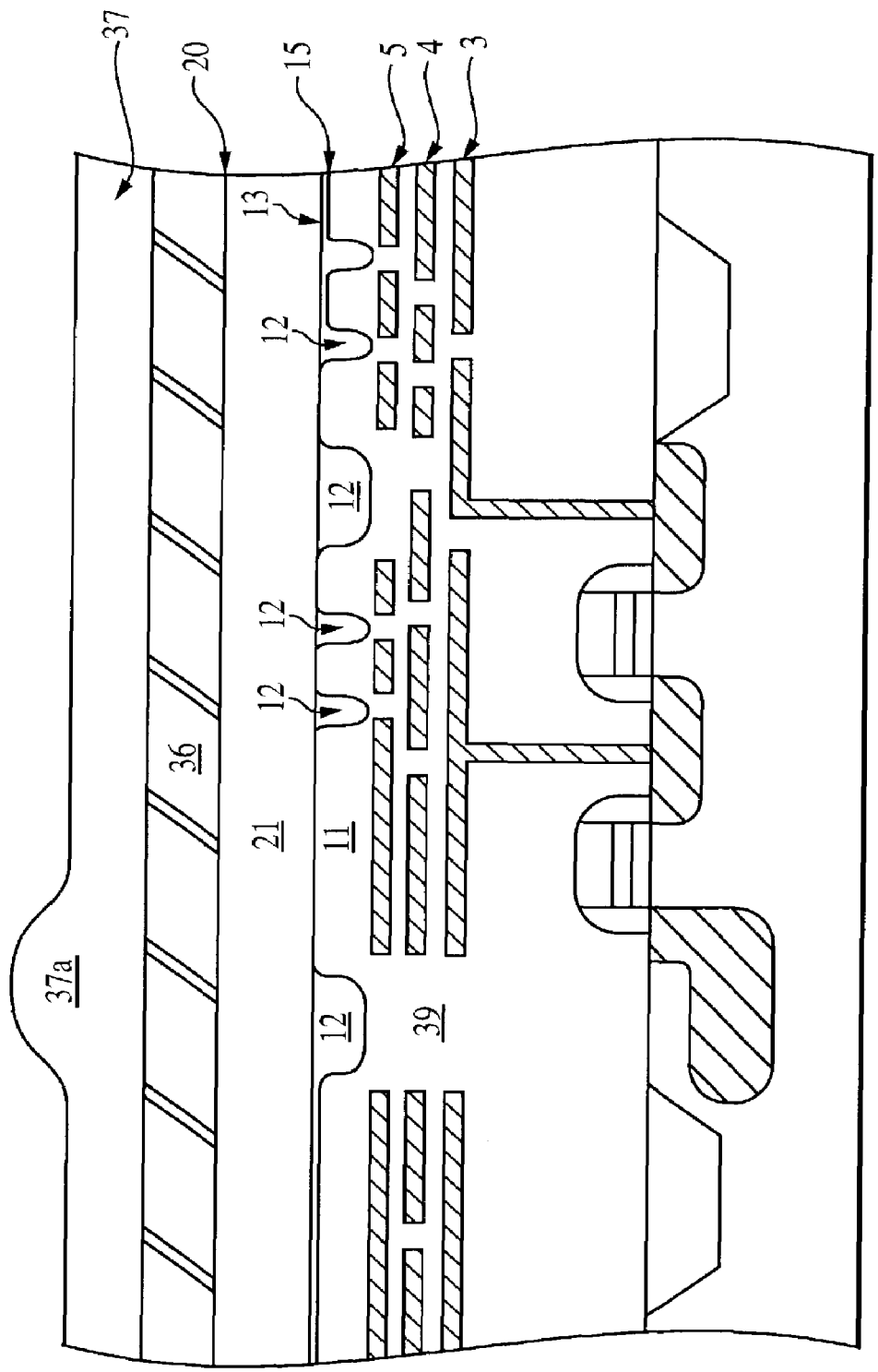
FIG. 7 is a cross-sectional view of the entire pixel cell according to another embodiment of the invention.

In another embodiment of the invention shown in FIG. 7, a flowable material such as a spin-on-glass material may be applied to the oxide passivation layer 11, then heated to form a spin-on-glass layer 12 over the oxide passivation layer 11. The spin-on-glass layer 12 is provided over the oxide passivation layer 11 such that the spin-on-glass material fills the "valley" regions 17 and covers the "bread-loaf" regions 16.

The spin-on-glass layer 12 and the "bread-loaf" regions 16 may be planarized together by CMP or dry etchback according to known techniques. Prior to planarization, the total thickness of the oxide passivation layer 11 and the spin-on-glass layer 12 is measured and the polish time is adjusted to achieve a desired thickness. Since spin-on-glass layer 12 and oxide passivation layer 11 are planarized simultaneously, the resulting surface 13 is planar. A nitride passivation layer 21 is deposited over the resulting planar surface 13. Because the resulting surface 13 is flat, the nitride passivation layer 21 likewise has a flat upper surface 20. Subsequently, a color filter array 36 and lens-forming layer 37 may be deposited over the nitride passivation layer 21.

Figure 8:
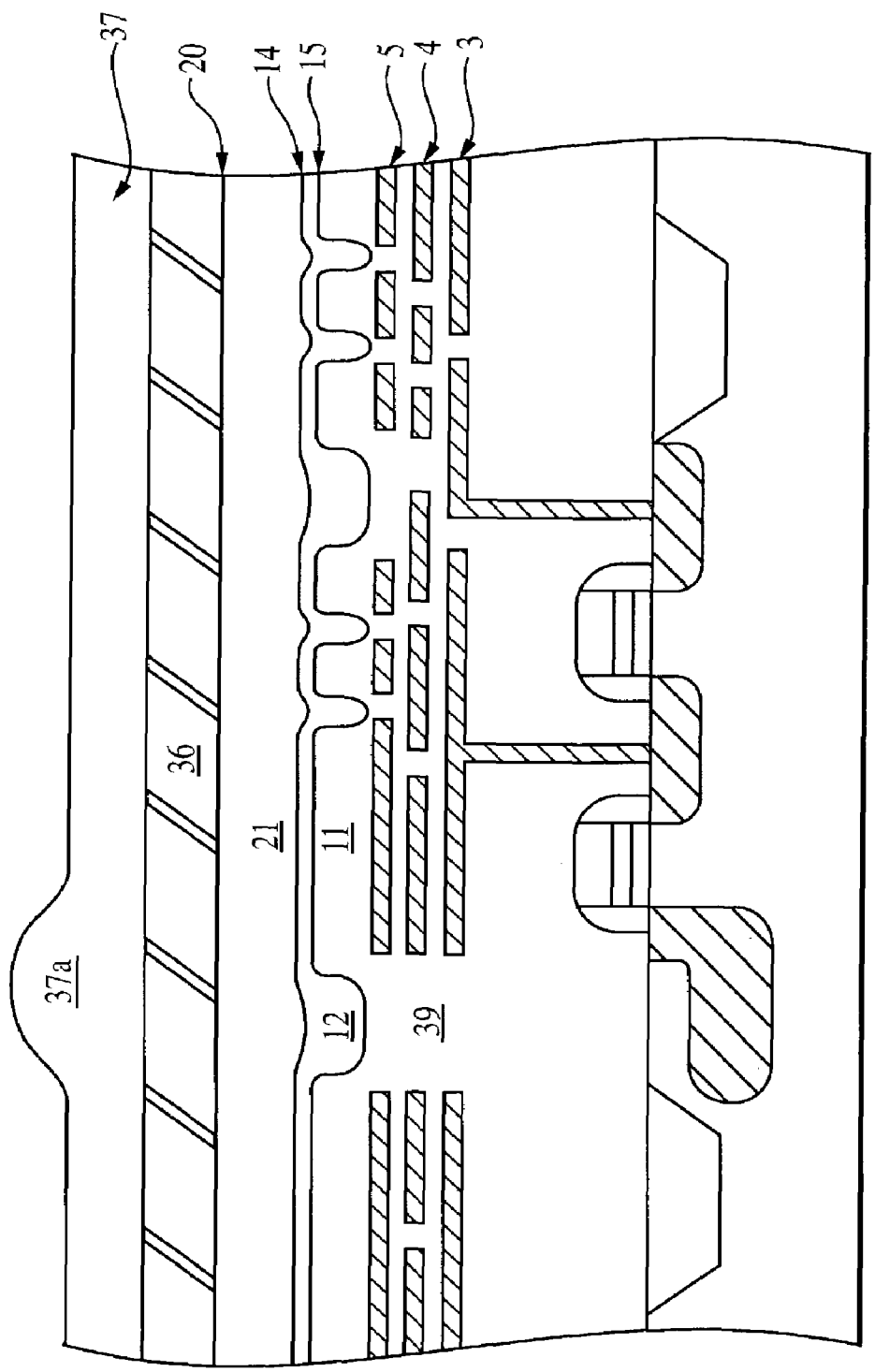
FIG. 8 is a cross-sectional view of the entire pixel cell according to another embodiment of the invention.

In another embodiment of the invention shown in FIG. 8, a flowable material such as spin-on-glass material may be applied to the oxide passivation layer 11, then heated to form the spin-on-glass layer 12 over the oxide passivation layer 11. The spin-on-glass layer 12 is provided over the uneven surface 15 of oxide passivation layer 11 such that the spin-on-glass material fills the "valley" regions 17 and covers the "bread-loaf" regions 16. The spin-on-glass layer 12 has a surface 14 which has less pronounced "valley" regions than that of oxide passivation layer 11. A nitride passivation layer 21 is deposited over the spin-on-glass layer surface 14. Nitride passivation layer 21 is then planarized to produce a flat upper surface 20. Subsequently, a color filter array 36 and lens-forming layer 37 may be deposited over the nitride passivation layer 21.

Figure 9:
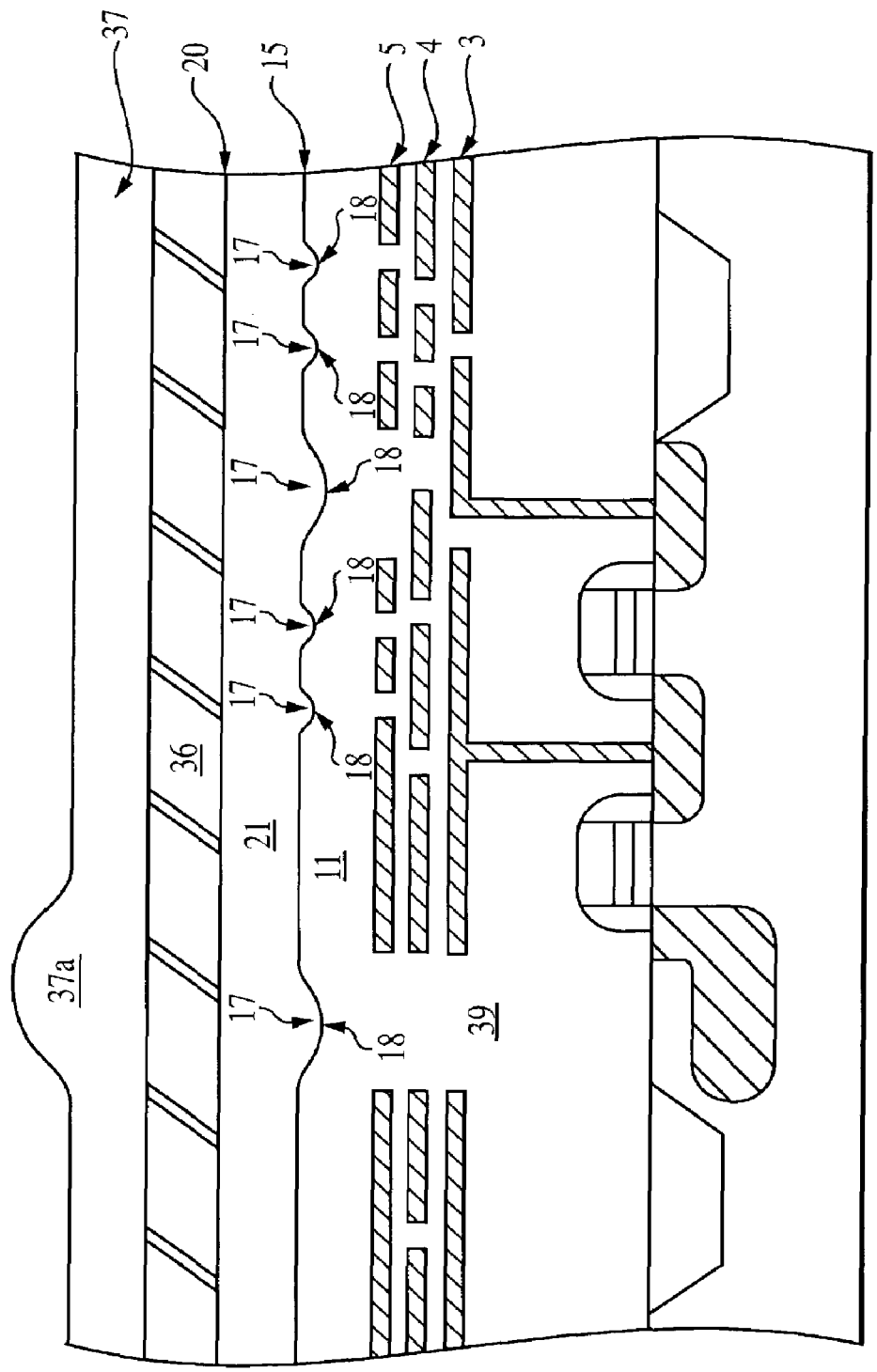
FIG. 9 is a cross-sectional view of the entire pixel cell according to another embodiment of the invention.

In another embodiment of the invention shown in FIG. 9, the oxide passivation layer 11 is deposited to a much greater thickness, such that the "valley" regions 17 have less steep slopes and are exhibited more as small dents in the surface 15 of oxide passivation layer 11. The bottoms 18 of "valley" regions 17 lie above the top surface of metal layer 5. A nitride passivation layer 21 is deposited over the surface 15 of oxide passivation layer 11. Nitride passivation layer 21 is then planarized to produce a flat upper surface 20. Subsequently, a color filter array 36 and lens-forming layer 37 may be deposited over the nitride passivation layer 21.

Figure 10:
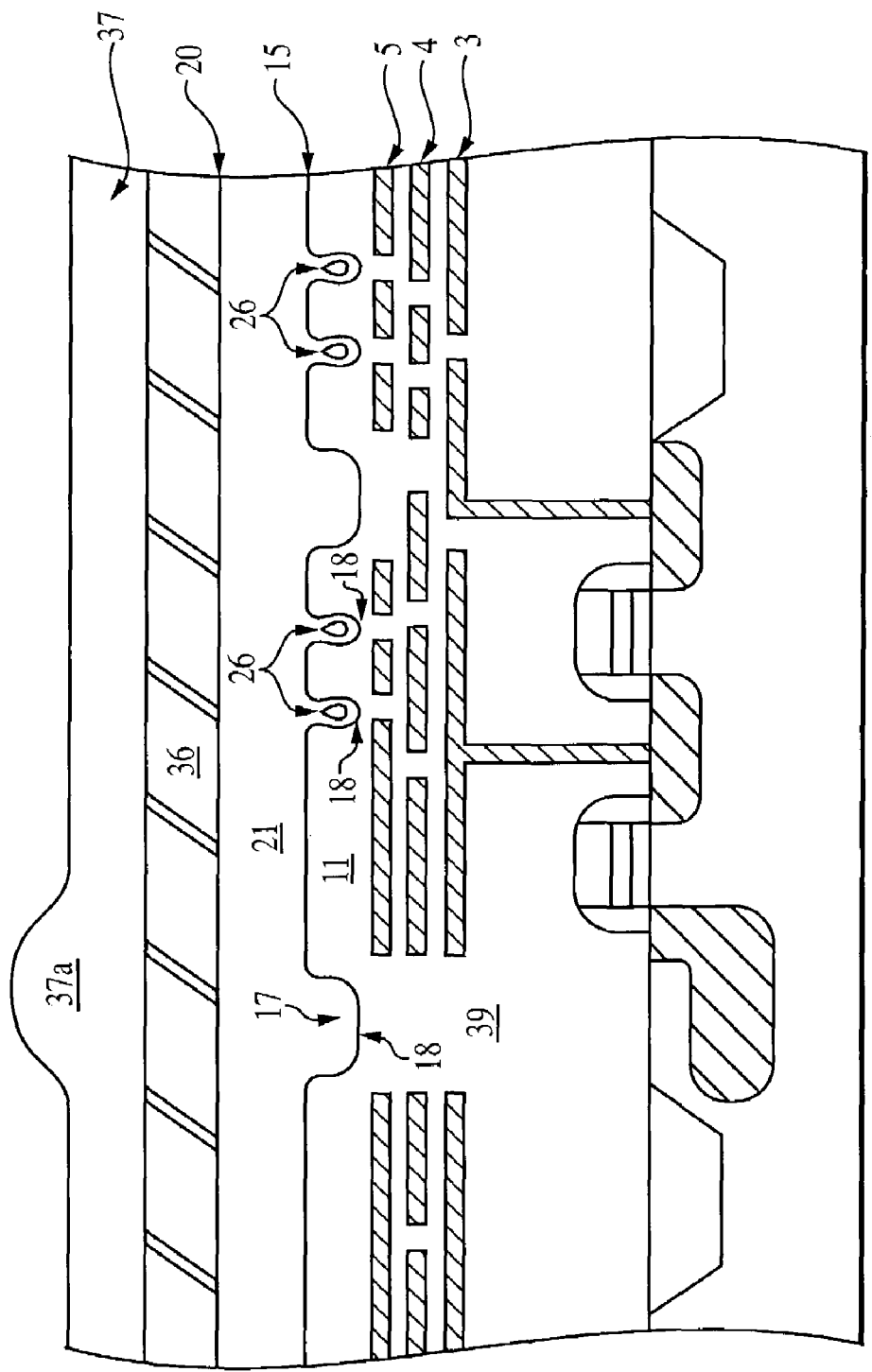
FIG. 10 is a cross-sectional view of the entire pixel cell according to another embodiment of the invention.

Another embodiment of the invention is shown in FIG. 10. The oxide passivation layer 11 is deposited such that some of the bottoms 18 of "valley" regions 17 lie below the top surface of metal layer 5. The nitride passivation layer 21 is deposited directly over the oxide passivation layer 11 to a greater thickness than would be if deposited in accordance with conventional methods. Keyholes 26 may still form in the "valley" regions 17. However, the nitride passivation layer 21 is deposited to a thickness such that the keyholes 26 are not exposed to the top surface of the nitride passivation layer 21. Nitride passivation layer 21 is then planarized to produce a flat upper surface 20. Planarization must be controlled such that the keyholes 26 will not be exposed to the surface of the nitride passivation layer 21. Subsequently, a color filter array 36 and lens-forming layer 37 may be deposited over the nitride passivation layer 21.

In yet another embodiment of the invention, a color filter array or a lens forming layer may be deposited directly over a first passivation layer.

It should be noted that although the invention has been described with specific reference to a CMOS imager, it also may be used in other imaging apparatuses, including a CCD imager. The above description and drawings illustrate preferred embodiments which achieve the features and advantages of the present invention. It is not intended that the present invention be limited to the illustrated embodiments. Please note, for example, that although the foregoing discussion relates to imaging apparatuses, the invention is also generally applicable to DRAMs, SRAMs, flash memory, microprocessors, and other semiconductor devices. The planarization of an oxide passivation layer to achieve a thin uniform nitride passivation layer is generally applicable to a variety of devices. Any modification of the present invention which comes within the spirit and scope of the following claims should be considered part of the present invention.

What is claimed as new and desired to be protected by Letters Patent of the United States is:

1. A method of forming a semiconductor device, said method comprising:
   providing a passivation layer located over a final metallization layer,
   wherein said passivation layer includes an oxide passivation layer;
   planarizing a surface of said passivation layer;
   stopping said planarizing before reaching said final metallization layer;
   forming a second layer over said passivation layer;
   providing a color filter array layer over said second layer;
   planarizing a surface of said color filter array layer; and
   providing a lens layer over said color filter array layer.

2. The method of claim 1, wherein said second layer includes a nitride passivation layer.

3. The method of claim 1, wherein said planarizing step includes chemical mechanical polishing.

4. The method of claim 1, wherein said planarizing step includes mechanical abrasion.

5. The method of claim 1, wherein said planarizing step includes etching.

6. The method of claim 5, wherein said etching is anisotropic.

7. The method of claim 5, wherein said etching includes a plasma etching step.

8. The method of claim 5, wherein said etching includes ion beam milling.

9. The method of claim 5, wherein said etching includes reactive ion etching.

10. The method of claim 1, wherein said semiconductor device is a CMOS imager.

11. The method of claim 1, wherein said semiconductor device is a CCD imager.

12. The method of claim 1, wherein said passivation layer includes a spin-on-glass layer.

13. A method of forming a pixel cell of an imaging device, said method comprising:
    forming a passivation layer over a final metallization layer;
    planarizing a surface of said passivation layer;
    stopping said planarizing before reaching said final metallization layer;
    forming a color filter array layer over said passivation layer;
    planarizing a top surface of said color filter array layer; and
    forming a lens forming layer over said color filter array layer.

14. The method of claim 13, wherein said top surface of said color filter array layer is planarized by chemical mechanical polishing.

15. The method of claim 13, wherein said top surface of said color filter array layer is planarized by mechanical abrasion.

16. The method of claim 13, wherein said top surface of said color filter array layer is planarized by etching.

17. The method of claim 13, wherein said top surface of said color filter array layer is planarized by forming a planarizing coating thereon.

18. The method of claim 13, wherein said imaging device is a CMOS imager.

19. The method of claim 13, wherein said imaging device is a CCD imager.

20. A method of forming a pixel cell of an imaging device, said method comprising:
    forming an oxide passivation layer over a top horizontal metal layer comprising a plurality of metal lines, said plurality of metal lines being a final metallization layer;
    chemical mechanical polishing a top surface of said oxide passivation layer;
    forming a nitride passivation layer over said oxide passivation layer;
    forming a color filter array layer over said nitride passivation layer;
    planarizing a surface of said color filter array layer; and
    providing a lens layer over said color filter array layer.

21. A method of forming a pixel cell of an imaging device, said method comprising:
    locating a nitride passivation layer over a top horizontal metal layer comprising metal lines, said metal lines being a final metallization layer;
    chemical mechanical polishing a top surface of said nitride passivation layer;
    forming a planarized color filter array layer over said nitride passivation layer; and
    providing a lens layer over said color filter array layer.

* * * * *